(12) United States Patent
Abadir et al.

(10) Patent No.: US 6,651,227 B2
(45) Date of Patent: Nov. 18, 2003

(54) METHOD FOR GENERATING TRANSITION DELAY FAULT TEST PATTERNS

(75) Inventors: Magdy S. Abadir, Austin, TX (US); Juhong Zhu, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 100 days.

(21) Appl. No.: 09/986,211

(22) Filed: Oct. 22, 2001

(65) Prior Publication Data

US 2003/0079189 A1 Apr. 24, 2003

(51) Int. Cl.$^7$ .............................................. G06F 17/50
(52) U.S. Cl. ......................................................... 716/4
(58) Field of Search ................................ 714/718, 726; 365/233; 716/2, 4, 6

(56) References Cited

U.S. PATENT DOCUMENTS

| | | | |
|---|---|---|---|
| 5,138,619 A | * 8/1992 | Fasang et al. | 714/718 |
| 5,278,842 A | 1/1994 | Berry, Jr. et al. | |
| 5,642,362 A | 6/1997 | Savir | |
| 5,657,292 A | * 8/1997 | McClure | 365/233 |
| 5,978,944 A | * 11/1999 | Parvathala et al. | 714/726 |

OTHER PUBLICATIONS

W.H.McAnney and J. Savir, Latch–To–Latch Delay Testing in LSSD Using a Three–Latch SRL, Oct. 1988 IBM Technical Disclosure Bulletin, 1997—2001 Delphion Inc., pp. 89–95.
Melvin A. Breuer et al., "Diagnosis & Reliable Design of Digital Systems", 1976 Computer Science Press, Inc., Chapter 3 "Test Generation For Sequential Circuits", pp. 90–105.
B. Konemann et al., "Delay Test: The Next Frontier for LSSD Test Systems", 1992 IEEE International Test Conference, Paper 30.3, pp. 578–587.
Alfred L. Crouch, "Design for Test for Digital IC's and Embedded Core Systems", pp. 72–75.
Jacob Savir et al., "On Broad–Side Delay Test", IBM Microelectronics Division, 1994, IEEE Transaction on CAD of ICS, pp. 284–290.
Carol Pyron et al., DFT Advances in Motorola's MPC7400, a PowerPC™ Microprocessor, 1999 IEEE, Paper 62, pp. 137–146.
Jacob Savir et al., "Scan–Based Transition Test", Aug., 1993 IEEE Transactions On Computer–Aided Design of Integrated Circuits and Systems, vol. 12, No. 8, pp. 1232–1241.
Nandu Tendolkar et al., "At–Speed Testing of Delay Faults for Motorola's MPC7400, a PowerPC™ Microprocessor", IEEE VTS, 2000, 6 pgs.

* cited by examiner

*Primary Examiner*—Matthew Smith
*Assistant Examiner*—Thuan Do
(74) *Attorney, Agent, or Firm*—Robert L. King; Joanna G. Chiu

(57) ABSTRACT

A method of generating transition delay fault test patterns creates first and second circuit models of a received circuit model. The second circuit model is a replication of the first circuit model. Each latch of the first circuit model is identified. On a sequential basis until the entire circuit model is transformed, the data input of an identified latch in the first circuit model is disconnected and the data output of the corresponding latch in the second circuit model is disconnected. The driver of the data input of the latch in the first circuit model is connected to what was driven by the data output of the corresponding latch in the second circuit model to form a transformed circuit model. Stuck-at fault testing using conventional ATPG tools is performed on the transformed circuit model and the resulting test vectors are translated to generate transition fault test patterns for the original received circuit model.

16 Claims, 4 Drawing Sheets

METHOD FOR GENERATING TRANSITION DELAY FAULT TEST PATTERNS

FIELD OF THE INVENTION

This invention relates generally to logic delay test methodology, and more specifically, to circuit design techniques and methods related to test pattern generation.

BACKGROUND OF THE INVENTION

Verifying correct circuit operation of digital logic circuits at their full speed clock rate remains an important activity for semiconductor manufacturers when testing integrated circuits. Static tests that assume and verify fixed logic states at predetermined test nodes are useful in verifying functionality of logic circuitry, but such tests do not verify proper operation at the system clock speed. When circuitry is operating at the system clock speed, some logic circuit signals may not propagate in time to be latched by output latches or internal latches. Defect mechanisms such as cross-talk, process variations, ground bounce, etc., affect circuit functionality by introducing delays. Such timing failures result in system failure. Failures that cause logic circuitry to malfunction at desired clock rates are known as delay faults. Therefore the purpose of delay testing is to verify that a circuit design operates correctly at a specific clock speed.

Two fault models that have been proposed for testing delay faults are the transition fault model and the path delay model. The path delay model assumes that a delay will manifest itself on a specific path of the circuit. As a result, there are a very large number of paths to test. The transition fault model assumes a gross delay, i.e., gate delay faults manifest themselves on all paths passing through the fault site. Hence, sensitizing any path that passes by the fault site is enough to detect the fault. The transition fault model requires pairs of vectors as test vectors. Two common methods to generate a transition fault test for scan-based designs are known as a skewed-load method and a broad-side method. In the skewed load test, a scan latch is loaded with a test pattern or vector from a tester. The first pattern sets up an initialization value for the logic to be tested. A second pattern or vector is a one-bit shift over the first pattern or vector and is also provided by the tester. The second pattern or vector must be sequentially clocked through the scan latch and needs to have a value that provokes a desired transition at the site of the fault. The effect of the transition is propagated to a primary output or to an observe point (i.e. a scan latch). Because the second pattern represents a one-bit shift over the first pattern, the second pattern may not readily provide a needed value to obtain the desired transition. The result is that there may be loss of coverage in testing certain delay faults by using the skewed-load test. Also, the skewed-load model requires the shift clock of the scan latch to operate at system speed. In most circuits, the scan clock of scan latches operates at a much slower speed due to performance and area factors of the scan latch design. As a result, the skewed-load test has a speed restraint. Additionally, the vector pairs that can be applied by skew-load testing might activate certain transactions that are impossible to activate functionally.

In the broad-side method, the second vector is not scanned from a tester, but rather is generated from the response of the design block driving the combinational circuitry being tested. Therefore, detailed knowledge of the circuitry in the driving block is required in order to know what inputs are required to generate a desired output value. The broad-side method requires two cycles of sequential processing and this method has limited capability to generate a rich set of two-pattern tests. The sequential processing of the broad-side method results in less than optimal fault coverage using commercially available automated test pattern generation (ATPG) tools. The two time-frame sequential processing is difficult for many commercially available ATPG tools and results in long run times and low coverage.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
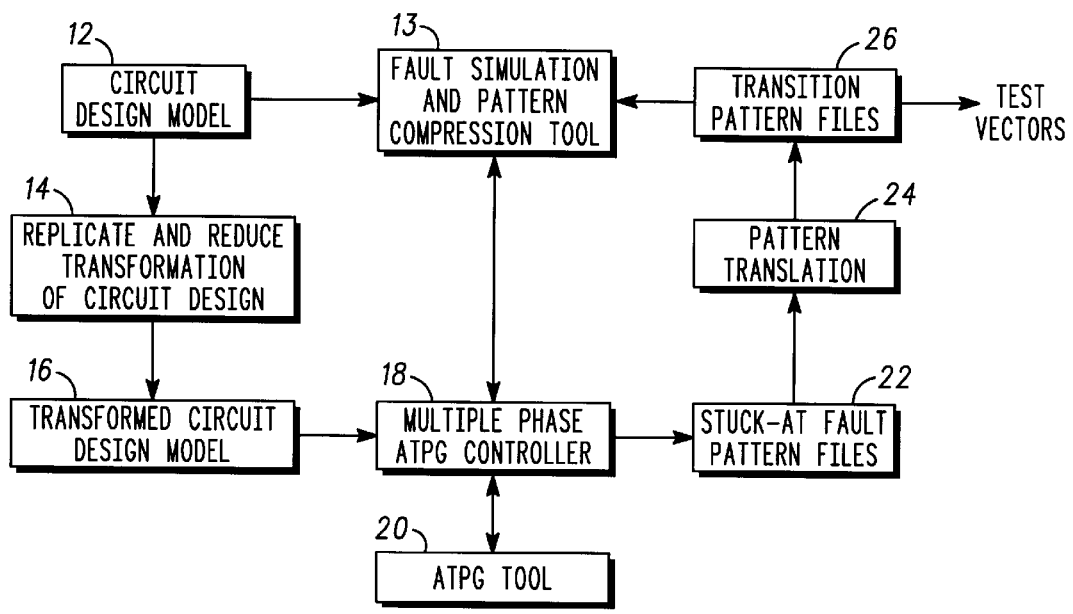
FIG. 1 illustrates in block diagram form a system for generating transition fault test patterns in accordance with the present invention.

Illustrated in FIG. 1 is a system 10 illustrating a data flow for generating transition fault test patterns. System 10 generally has a Circuit Design Model 12 containing a software representation of a circuit design. The circuit design is any electronic design and may be either a design of an entire integrated circuit or a portion thereof. Circuit Design Model 12 may be stored on a disk drive or by any other electronic storage medium. The Circuit Design Model 12 is provided to a Replicate and Reduce Transformation of Circuit Design Tool 14 for performing a Replicate and Reduce Transformation 14 of the circuit design. The Replicate and Reduce Transformation 14 steps will be discussed below in connection with FIG. 2 and results in a Transformed Circuit Design Model 16. The Transformed Circuit Design Model 16 is provided to a Multiple Phase ATPG (automated test pattern generator) Controller 18. The Multiple Phase ATPG Controller 18 interacts with an ATPG Tool 20 to perform selected ATPG functions on the Transformed Circuit Design Model 16. The test information generated by the ATPG Tool 20 under control of the Multiple Phase ATPG Controller 18 is used to create fault test pattern files as identified by the Stuck-At Fault Pattern Files 22. The Multiple-Phase ATPG Controller 18 functions in one phase to implement steps 42, 44 and 46 of FIG. 2 and functions in another phase to implement steps 48, 49 and 50. The Stuck-At-Fault Pattern Files 22 undergo a translation by a Pattern Translation 24 and are used to generate Transition Pattern Files 26. Pattern Translation 24 typically involves the insertion of the required clock sequence to guarantee proper behavior of the received circuit model 12. The method taught herein is applicable to systems with a single clock or multiple clocks. The method taught herein is also applicable to flip-flop based designs and level sensitive scan designs and any clock-based scan design. The Transition Pattern Files 26 are stored and selectively provided to a tester (not shown) as Test Vectors. Optionally, the Transition Pattern Files 26 is used to perform fault simulation and pattern compression. The Fault Simulation and Pattern Compression Tool 13 simulates the transition test patterns on the original Circuit Design Model 12 and eliminates redundant vectors. The simulation results are used by Multiple Phase ATPG Controller 18 to revise and refine the Stuck-At Fault list that needs to be operated on the ATPG Tool 20. This process can be repeated through steps 18, 22, 24, 26 and 13 to ultimately increase the coverage of the test vectors provided by Transition Pattern Files 26.

Figure 2A:
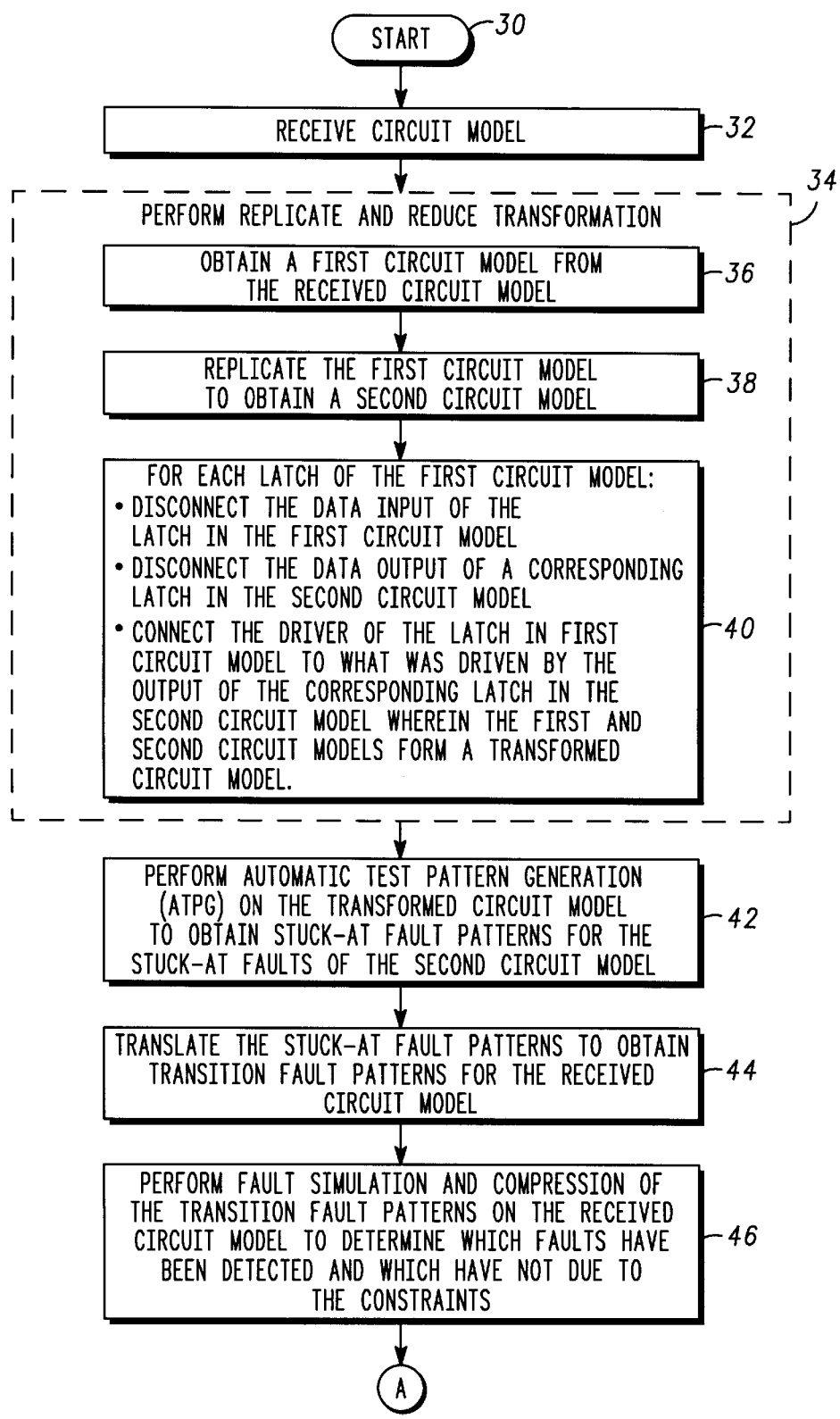
FIGS. 2A and 2B illustrate in flowchart form a method for generating transition fault test patterns by transformation of a circuit design model.
Figure 2B:
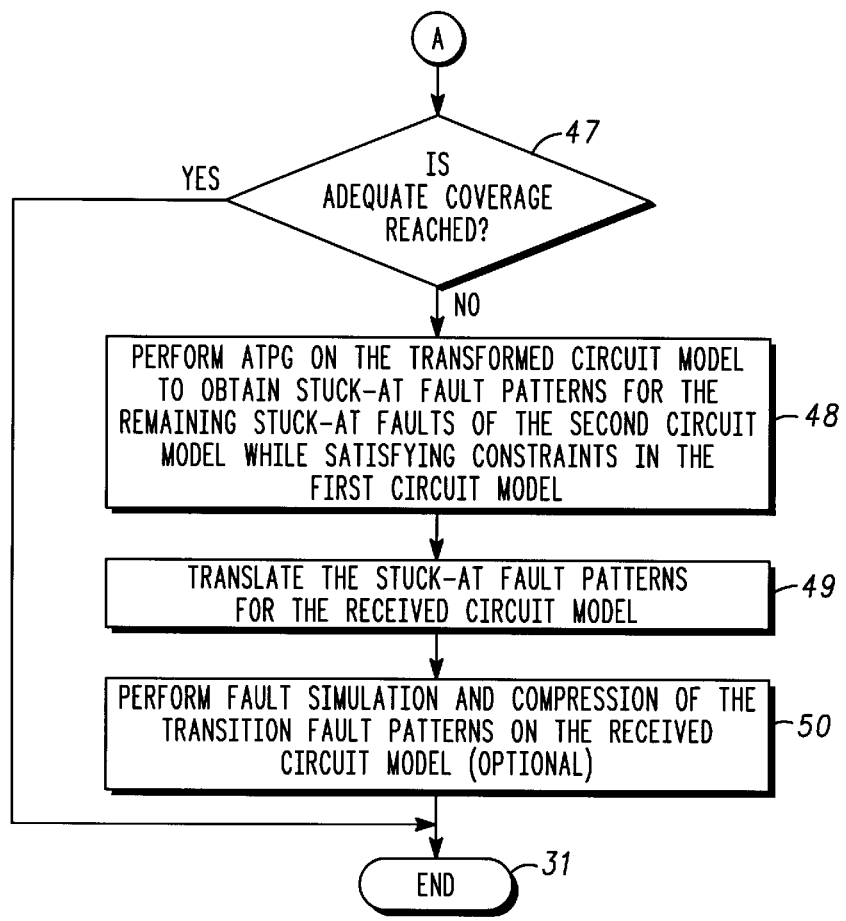

Illustrated in FIG. 2 is a flowchart of a portion of the data flow of System 10 of FIG. 1. After a Start step 30, the circuit model database is received in a Step 32. In a Step 34, a flow is illustrated for implementing the Replicate and Reduce Transformation of the circuit model database. Step 34 applies to all circuitry in the circuit model database. In a step 36, a first circuit model is obtained from the received circuit model. After completing the entire data flow a specific circuit example of these steps will be described in connection with FIGS. 3–4. In a step 38, the first circuit model is replicated (i.e. copied or duplicated) to obtain a second circuit model. The second circuit model is the same circuitry as the first circuit model (i.e. a replica thereof). Each latch that is present in the circuit model is identified. It should be well understood that the term 'latch' as used herein applies to any clocked storage device, whether a flip-flop, a register or a clocked buffer/driver. In step 40, for each latch of the first circuit model, certain steps are implemented. It should be understood that the location of each latch depends upon the design, including being located in a feedback path. The data input of each identified latch of the first circuit model is disconnected. The data output of the corresponding latch (i.e. same duplicated latch) in the second circuit model is disconnected. The driver (i.e. the signal source) of the data input of the latch in the first circuit model is connected to what was driven by the output of the corresponding latch in the second circuit model. The first and second circuit models therefore form a transformed circuit model. Step 40 implements a replicate-and-reduce function by replicating the circuitry with reduced connectivity.

In a step 42, an automatic test pattern generation (ATPG) is applied to the transformed circuit model (i.e. on the first and second circuit models) to obtain multiple patterns for a set of the stuck-at faults of the second circuit model (without any constraints). The stuck-at fault patterns are translated in a step 44 to obtain transition fault patterns for the received circuit model. In step 46, fault simulation and compression are performed using the transition fault patterns on the received circuit model. In this step 46 we determine which transition faults have been detected fortuitously and which have not due to the constraints. In a step 47, a determination is made as to whether the coverage is adequate at this point. If the coverage is adequate, the fault test pattern generation concludes with an end step 31. If the coverage is still low, then a revised stuck-at fault subset list is generated in a step 48 with the Multiple Phase ATPG Controller 18. The ATPG tool 20 is executed with constraint conditions applied and the testing proceeds on a fault-by-fault basis on the remaining subset of stuck-at faults. It should be understood that the subset of stuck-at faults could be a null set having no remaining stuck-at faults. The stuck-at fault patterns are translated in a step 49 to obtain additional transition fault patterns for the received circuit model. In an optional step 50, fault simulation and compression are performed using all the previously generated transition fault patterns on the received circuit model to generate a compressed pattern file. The transition fault test pattern generation concludes with an end step 31.

Figure 3:
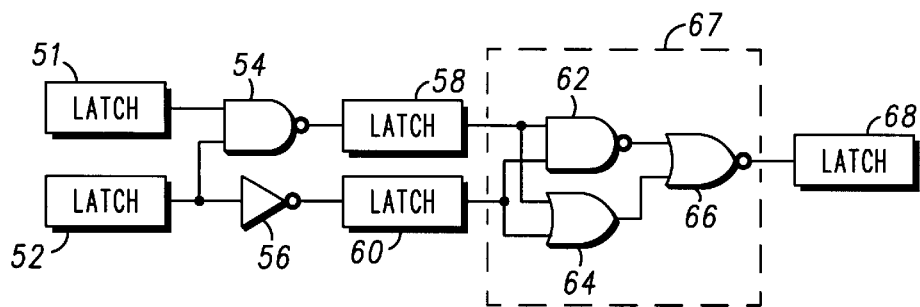
FIG. 3 illustrates in logic diagram form a circuit design model requiring delay testing.

Illustrated in FIG. 3 is a circuit model that is received in Step 32 of FIG. 2. The circuit model has a scan latch 51 connected to a first input of a NAND gate 54. A scan latch 52 is connected to a second input of NAND gate 54 and to a first input of an inverter 56. An output of NAND gate 54 is connected to a data input of a scan latch 58. An output of inverter 56 is connected to a data input of a scan latch 60. An output of scan latch 58 is connected to a first input of a NAND gate 62 and to a first input of an OR gate 64. An output of scan latch 60 is connected to a second input of NAND gate 62 and to a second input of an OR gate 64. An output of NAND gate 62 is connected to a first input of a NOR gate 66. An output of OR gate 64 is connected to a second input of NOR gate 66. An output of NOR gate 66 is connected to a data input of an output scan latch 68. In the illustrated form, scan latches 51, 52, 58 and 60 form a plurality of storage devices. The circuit of FIG. 3 is by example only and it should be well understood that the present invention applies to any circuitry having a scan latch. In the illustrated form, scan latch 58 and 60 will be selected to test transition faults associated with all the circuitry 67 between scan latches 58 and 60 and output latch 68.

Figure 4:
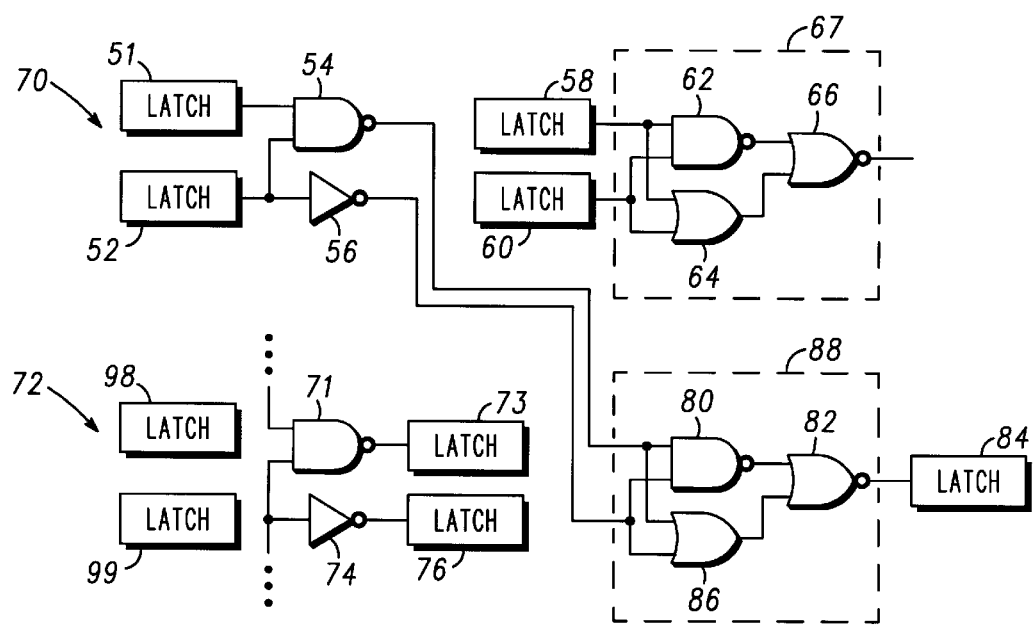
FIG. 4 illustrates in logic diagram form a transformation of the circuit design of FIG. 3 in accordance with the present invention.

Illustrated in FIG. 4 is a circuit that has been replicated and reduced pursuant to step 34 of FIG. 2. A first circuit model 70 is obtained and corresponds to the circuit of FIG. 3. For convenience of illustration, common elements shared in the first circuit model 70 and FIG. 3 will be assigned the same element numbers. The first circuit model 70 is replicated into a second circuit model 72. A NAND gate 71 has first and second inputs. The second input of NAND gate 71 is connected to an input of an inverter 74. An output of NAND gate 71 is connected to a scan latch 73. An output of inverter 74 is connected to a scan latch 76 also containing an irrelevant storage value. The data inputs of scan latches 58 and 60 have been disconnected. Similarly, the outputs of registers 73 and 76 are disconnected. The output of NAND gate 54 is now connected to both a first input of NAND gate 80 and to a first input of OR gate 86. An output of inverter 56 is connected to a second input of NAND gate 80 and to a second input of an OR gate 86. An output of NAND gate 80 is connected to a first input of a NOR gate 82. An output of OR gate 86 is connected to a second input of NOR gate 82. An output of NOR gate 82 is connected to a data input of a scan latch 84. Note that latches 98 and 99 have been replicated from latches 51 and 52, respectively, but are not connected for use in testing the gates in box 67.

The data inputs of latches 58 and 60 are therefore disconnected within first circuit model 70. The data outputs of corresponding latches 73 and 76 in the second circuit model 72 are disconnected. A driver of the data input of latch 58, which is the output of NAND gate 54, is connected to the corresponding portion of circuitry within second circuit model 72 that was previously driven by the output of latch 58. Similarly, the driver of the data input of latch 60, which is the output of inverter 56, is connected to the corresponding portion of circuitry within second circuit model 72 that was previously driven by the output of latch 60. In this manner, the first circuit model 70 and the second circuit model 72 form or create a transformed circuit model of the circuit of FIG. 3. The transformation is to an easier domain for the ATPG tool to create stuck-at fault test patterns. The replication results in a circuit portion having NAND gate 54, inverter 56, NAND gate 80, OR gate 86, NOR gate 82 and output latch 84 that can be tested as combinatorial logic with no intervening latches. By scanning appropriate logic values in latches 51 and 52, stuck-at faults in the circuitry contained within box 88 are targeted by the ATPG Tool 20.

To more generally illustrate the theory behind the replicate and reduce transformation, detecting a slow-to-rise transition (i.e. a zero-to-one transition) fault on the output of one of the gates in box 67 of FIG. 3 is equivalent to detecting a stuck-at-zero fault on the output of the corresponding gate inside box 88 of FIG. 4 while satisfying a constraint that the output of the corresponding gate in box 67 of FIG. 4 is at value zero. Similarly, detecting a slow-to-fall transition (i.e. a one-to-zero transition) fault on the output of one of the gates in box 67 of FIG. 3 is equivalent to detecting a stuck-at-one fault on the output of the corresponding gate inside box 88 of FIG. 4 while satisfying a constraint that the output of the corresponding gate in box 67 of FIG. 4 is at value one. For example, to detect a slow-to-rise transition fault on the output of NAND gate 62 in the originally received circuit design model is equivalent to detecting a stuck-at-zero fault at the output of NAND gate 80 of the transformed circuit of FIG. 4 while satisfying the constraint that the output of NAND gate 62 of FIG. 4 is at value zero.

By now it should be apparent that there has been provided a method that provides high coverage for at-speed transition fault testing by using a circuit replicate and reduce transformation. No modification of the circuit design itself is required when the circuitry is replicated and transformed for stuck-at and transition fault testing. A transformation has been made by going from a sequential time domain wherein sequential ATPG tool was required to generate the tests to a combinational domain wherein a combinational ATPG tool is required to generate the same test functionality. Because the method is automated, no intensive engineering efforts are required to implement the transition fault testing. The present invention applies to full-scan designs and partial scan designs. Because the present invention is provided for use with conventional ATPG tools, the effectiveness of existing test vector analysis equipment is improved. The method provided herein results in higher test coverage for transition delay faults in complex designs as compared with prior methods. As a result, additional functional testing is eliminated and hence the need for expensive test equipment is reduced.

Various modifications and embodiments of the present invention may be implemented while remaining in the scope and spirit of the invention. For example, multiple scan latches of a received design model may be identified and the transformation taught herein performed in parallel for all such identified latches or the transformation may be done in a sequential manner. The received design model may have multiple clock domains. Also, the received design model may contain gates, transistors or memory arrays. The only limitation on what circuitry that the received design model may contain is that the received design model must be in a form that the selected ATPG tool is capable of comprehending and processing. Various circuits may be used for the scan latches. Any type of electronic circuit may be represented by the received circuit design model to be tested. Large designs may be readily processed while avoiding sequential explosion (time and memory problems).

The method taught herein provides an ability to identify redundant delay transition faults in the design. A transition delay fault is redundant if the corresponding stuck-at fault in the transformed circuit is redundant either with or without satisfying the constraints. Hence redundant stuck-at faults found during steps 42 and 48 indicate redundant transition faults.

The methods taught herein may be implemented by software instructions stored via a computer readable medium. The computer readable medium may include one or more of memory, floppy disks, compact discs, magnetic tape, etc. The software instructions stored on the computer readable medium to implement the method taught herein may be grouped into various sets of instructions, each set performing a predetermined one of the various steps of the method.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for generating transition fault test patterns for a circuit design, comprising:
    obtaining a first circuit model corresponding to the circuit design;
    replicating the first circuit model to obtain a second circuit model;
    selecting a storage device within the first circuit model;
    disconnecting a data input of the storage device in the first circuit model;
    disconnecting a data output of a corresponding storage device in the second circuit model;
    coupling a driver of the storage device in the fist circuit model to a portion of the second circuit model that was driven by the data output of the corresponding storage device in the second circuit model, wherein the first and second circuit models form a transformed circuit model; and
    using the transformed circuit model to generate transition fault test patterns for the circuit design.

2. The method of claim 1, wherein obtaining the first circuit model comprises:
    identifying a circuit design model corresponding to the circuit design; and
    generating the first circuit model from the circuit design model, the first circuit model being a replica of the circuit design model.

3. A method for generating transition fault test patterns for a circuit design, comprising:
    obtaining a first circuit model corresponding to the circuit design;
    replicating the first circuit model to obtain a second circuit model;
    selecting a storage device within the first circuit model:
    disconnecting a data input of the storage device in the first circuit model;
    disconnecting a data output of a corresponding storage device in the second circuit model;
    coupling a driver of the storage device in the fist circuit model to a portion of the second circuit model that was driven by the data output of the corresponding storage device in the second circuit model, wherein the first and second circuit models form a transformed circuit model; and using the transformed circuit model to generate transition fault test patterns for the circuit design, wherein using the comprising:

performing automatic test pattern generation (APTG) on the transformed circuit model to obtain stuck-at-fault patterns for a set of stuck-at faults of the second circuit model;

translating the stuck-at fault patterns to obtain transition fault test patterns for the circuit design; and performing fault simulation of the transition fault test patterns on the circuit design to determine a subset of stuck-at faults within the set of stuck-at faults that were not satisfied.

4. The method of claim 3 further comprising determining that the subset of stuck-at faults is a null set.

5. The method of claim 3, further comprising:

if the subset of stuck-at faults is not a null set, performing ATPG on the transformed circuit model to obtain stuck-at fault patterns corresponding to the subset of stuck-at faults while satisfying constraints in the first circuit model.

6. The method of claim 1, further comprising selecting the storage device from one of a plurality of storage devices within the first circuit model, and the disconnecting the data input and coupling the driver are performed for each of the plurality of storage devices and a corresponding storage device of each of the plurality of storage devices within the second circuit model.

7. A method for generating transition fault test patterns for a circuit design, comprising:

obtaining a first circuit model corresponding to the circuit design;

replicating the first circuit model to obtain a second circuit model;

selecting a storage device within a feedback path of the first circuit model;

disconnecting a data input of the storage device in the first circuit disconnecting a data output of a corresponding storage device in the second circuit model;

coupling a driver of the storage device in the fist circuit model to a portion of the second circuit model that was driven by the data output of the corresponding storage device in the second circuit model, wherein the first and second circuit models form a transformed circuit model; and using the transformed circuit model to generate transition fault test patterns for the circuit design.

8. A system for generating transition fault test patterns for a circuit design, comprising:

receiving means for obtaining a first circuit model corresponding to the circuit design;

replicating means coupled to the receiving means for replicating the first circuit model to obtain a second circuit model;

selection means coupled to the replicating means for selecting a storage device within the first circuit model;

transformation means coupled to the selection means, comprising:

means for disconnecting a data input of the storage device in the first circuit model;

means for disconnecting a data output of a corresponding storage device in the second circuit model; and means for coupling a driver of the storage device in the first circuit model to a portion of the second circuit model that was driven by the data output of the corresponding storage device in the second circuit model, wherein the first and second circuit models form a transformed circuit model; and test generating means coupled to the transformation means, for using the transformed circuit model to generate transition fault test patterns for the circuit design.

9. The system of claim 8, wherein the receiving means comprises:

means for receiving a received circuit model corresponding to the circuit design; and means for generating the first circuit model from the received circuit model, the first circuit model being a replica of the received circuit model.

10. A system for generating transition fault test patterns for a circuit design, comprising:

means for receiving a received circuit model corresponding to the circuit design;

means for generating a first circuit model from the received circuit model and corresponding to the circuit design, the first circuit model being a replica of the received circuit model;

replicating means coupled to the means for receiving, the replicating means replicating the first circuit model to obtain a second circuit model;

selection means coupled to the replicating means for selecting a storage device within the first circuit model;

transformation means coupled to the selection means, comprising:

means for disconnecting a data input of the storage device in the first circuit model;

means for disconnecting a data output of a corresponding storage device in the second circuit model; and means for coupling a driver of the storage device in the first circuit model to a portion of the second circuit model that was driven by the data output of the corresponding storage device in the second circuit model, wherein the first and second circuit models form a transformed circuit model; and test generating means coupled to the transformation means, for using the transformed circuit model to generate transition fault test Patterns for the circuit design, wherein the test generating means comprises:

automatic test pattern generation means (ATPG) for performing automatic test pattern generation on the transformed circuit model to obtain stuck-at faults of the second circuit model;

translating means coupled to the automatic test pattern generation means, for translating the stuck-at fault patterns to obtain transition fault test patterns for the circuit design; and fault simulation means coupled to the translating means, for performing fault simulation of the transition fault test patterns on the circuit design to determine a subset of stuck-at faults within the set of stuck-at faults that were not satisfied.

11. A method for generating transition fault test patterns for a circuit design, comprising:

obtaining a first circuit model corresponding to the circuit design;

replicating the first circuit model to obtain a second circuit model;

selecting predetermined circuitry within the first circuit model;

disconnecting a data input of the predetermined circuitry in the first circuit model;

disconnecting a data output of corresponding circuitry in the second circuit model;

coupling the data input of the predetermined circuitry in the first circuit model to a portion of the second circuit model that was driven by the data output of the corresponding circuitry in the second circuit model, wherein the first and second circuit models form a transformed circuit model; and providing the transformed circuit model, wherein the transformed circuit model is used for generating transition fault test patterns for the circuit design.

12. The method of claim 11 further comprising:

receiving a circuit model to provide a received circuit model corresponding to the circuit design; and obtaining the first circuit model being a replica of the received circuit model.

13. The method of claim 11, further comprising:

performing automatic test pattern generation (ATPG) on the transformed circuit model to obtain stuck-at fault patterns for a set of stuck-at faults of the second circuit model;

translating the stuck-at fault patterns to obtain transition fault test patterns for the circuit design; and performing fault simulation of the transition fault test patterns on the circuit design to determine a subset of stuck-at faults within the set of stuck-at faults that were not satisfied.

14. The method of claim 13 wherein the subset of stuck-at faults is a null set.

15. The method of claim 13, further comprising:

performing automatic test pattern generation on the transformed circuit model to obtain stuck-at fault patterns corresponding to the subset of stuck-at faults while satisfying constraints in the first circuit model.

16. The method of claim 11, wherein the predetermined circuitry is one of a plurality of storage devices within the first circuit model wherein the second circuit model comprises a plurality of corresponding storage devices.

\* \* \* \* \*

UNITED STATES PATENT AND TRADEMARK OFFICE
CERTIFICATE OF CORRECTION

PATENT NO.    : 6,651,227 B2
DATED         : November 18, 2003
INVENTOR(S)   : Magdy S. Abadir and Juhong Zhu It is certified that error appears in the above-identified patent and that said Letters Patent is hereby corrected as shown below:

<u>Column 7,</u>
Line 43, change "first circuit" to -- first circuit model; --

<u>Column 8,</u>
Line 48, change "test Patterns" to -- test patterns --

Signed and Sealed this

Third Day of August, 2004

JON W. DUDAS
*Acting Director of the United States Patent and Trademark Office*